United States Patent
Lan et al.

[11] Patent Number: 5,854,134
[45] Date of Patent: Dec. 29, 1998

[54] PASSIVATION LAYER FOR A METAL FILM TO PREVENT METAL CORROSION

[75] Inventors: Chao-Yi Lan; Shean-Ren Horng, both of Hsinchu; Yun-Hung Shen; Hung-Jen Tsai, both of Taipei, all of Taiwan

[73] Assignee: Taiwan Semiconductor Manufacturing Company Ltd., Hsin-Chu, Taiwan

[21] Appl. No.: 851,399

[22] Filed: May 5, 1997

[51] Int. Cl.$^6$ .................................................. H01L 21/302
[52] U.S. Cl. ........................ 438/695; 438/696; 438/705; 438/720; 438/734
[58] Field of Search ..................... 438/694, 695, 438/696, 705, 720, 734

[56] References Cited

U.S. PATENT DOCUMENTS

| 5,202,291 | 4/1993 | Charvat et al. | 437/245 |
|---|---|---|---|
| 5,378,653 | 1/1995 | Yanagida | 437/194 |
| 5,397,432 | 3/1995 | Konno et al. | 156/665 |
| 5,399,236 | 3/1995 | Ha et al. | 156/643 |
| 5,451,293 | 9/1995 | Tabara | 216/13 |

FOREIGN PATENT DOCUMENTS

| 59-132622 | 7/1984 | Japan . |
|---|---|---|
| 60-249151 | 12/1985 | Japan . |
| 62-032609 | 2/1987 | Japan . |
| 03-136240 | 6/1991 | Japan . |
| 03-136275 | 6/1991 | Japan . |

OTHER PUBLICATIONS

"In Line Plasma Etching of Aluminum"; Proc–Electrochemical Soc.; 1982; 82–6–Proc. Sym Plasma Process, 3rd, 1981; abstract only; Donohoe.

*Primary Examiner*—Benjamin Utech
*Assistant Examiner*—George Goudreau
*Attorney, Agent, or Firm*—George O. Saile; Stephen B. Ackerman; William J. Stoffel

[57] ABSTRACT

The invention provides a method of fabricating corrosion free metal lines. The method involves forming a thin polymeric passivation layer 30 over the metal layer 20 immediately after the metal deposition and before any photolithographic or etching processes. The polymeric passivation layer 30 is formed using a F-containing gas plasma treatment. The passivation layer prevents corrosion of the metal layer before a metal etch. The passivation layer is preferably composed of a polymeric of C, O, and F and has a thickness in a range of between about 40 and 80 Å. The passivation layer is formed using a F-containing plasma treatment at a power of between 225 and 275 W, a pressure between about 80 and 120 mtorr, a $CHF_3$ flow between about 40 and 60 sccm and for a duration between about 10 to 30 seconds. Following this, the metal layer is patterned using photo and etch steps.

22 Claims, 3 Drawing Sheets

PASSIVATION LAYER FOR A METAL FILM TO PREVENT METAL CORROSION

BACKGROUND OF THE INVENTION

1) Field of the Invention

This invention relates generally to the fabrication of corrosion free metal lines for a semiconductor device and more particularly to a method for a fluorine plasma treatment for metal layers in a semiconductor device.

2) Description of the Prior Art

This invention relates to the prevention of corrosion of a metal layer before any etches. Corrosion of metal layers in semiconductor devices is a major problem. The process of forming metal layers and the corrosion problem is described below.

A metal layer is formed over the whole surface of a substrate composed of a silicon wafer. The metal layer is composed of thin films of Aluminum or thin films of an alloy in which silicon (Si) or Cooper (Cu). The surface of the substrate on which the wiring layer is formed is generally covered with an insulating layer composed of $SiO_2$, etc. The surface of the substrate or a lower layer of wiring is exposed inside a contact hole provided on a part of the insulating layer. To prevent an increase in contact resistance of an aluminum or aluminum alloy thin film wiring due to an alloy reaction with a silicon wafer, a so-called barrier metal of thin film of Ti, TiN or TiW is provided between the silicon wafer and the aluminum thin film.

We have found that if the wafers are stored for relatively short periods of time, the metal layer corrodes. Often wafers are "banked" or stored with the metal layer unprotected and unpatterned. The wafers are stored or "banked" because they are awaiting customer orders or the next process issue. We have observed corrosion on wafers stored from as little as about 12 hours. The corrosion problem is worse when the wafers are banked for a long period of time. The present invention protects the metal layers from corrosion at this stage in the fabrication process (before any further steps such as etch or photo steps).

Next, the wafers are coated by a resist. By applying ultra-violet rays, electron beams or an energy beams, such as excimer laser, a mask composed of the aforesaid resist is formed.

The metal layer is then etched using the photoresist mask as an etch mask. The metal layer is etched in a RIE apparatus using for example a chlorine gas. As a resulting the aluminum film is anisotropically etched forming a metal wiring pattern. The photoresist is then removed by an ashing process. An oxygen gas plasma is used to react with the photoresist.

If the substrate upon which etching and ashing have been performed as describe above is exposed to the atmosphere, a phenomenon is often recognized in that "after-corrosion" occurs in wiring composed of thin films of aluminum or an alloy of aluminum. The resistance of the wiring increases due to this after-corrosion and in extreme cases disconnection occurs. Such "after corrosion" continues even after the metal layer is covered with insulation and continues over the life of the device.

The mechanism causing such "after corrosion" is not yet completely understood. It is considered that after-corrosion is due to the fact that chlorine, bromine, or other compounds, which are components of the etchant used in etching can, remain on the surface of an aluminum line. That is, the residual chlorine, for example, reacts with the water in the atmosphere, generating hydrochloric acid (HCl) etc., which causes aluminum films to corrode.

Others have striven to reduce metal corrosion after the metal layer is etched. For example, U.S. Pat No. 5,378,653 (Yanagida) shows a method of post Al etch plasma treatment. U.S. Pat No. 5,451,293 (Tabara) teaches a method of ashing a photoresist layer using H and O containing gas with a F containing gas which removes HCl from a metal. U.S. Pat No. 5,202,291 (Charvat et al.) shows formation of a sidewall Photoresist coating during an Al metal etch using $CF_4$, $Cl_2$, and $Br_3$. U.S. Pat No. 5,397,432 (Konno et al.) shows a method of preventing HCl corrosion post metal etch by treating the wafer with a RIE etch using $H_2O$ vapor or other neutral active species. U.S. Pat No. 5,399,236 (Ha et al.) shows a method of removing photoresist from a metal line post metal etch using alkyl ketone or alkyl ether in an oxygen plasma ash chamber.

However, there is still a need for an improved process to prevent corrosion of metal layers immediately after the metal layers are deposited and before any photolithographic or etching processes are performed on the metal layer.

SUMMARY OF THE INVENTION

It is an object of the present invention to provide a method for that prevents the corrosion of metal layers after the metal layers are deposited.

It is an object of the present invention to provide a method for fabricating a passivation layer over a metal layer within one hour after the formation of the metal layer that prevents corrosion of the metal layer.

It is an object of the present invention to provide a method for a F-containing gas plasma treatment of an Al—Si alloy metal layer that forms a polymer passivation layer over the metal layer.

To accomplish the above objectives, the present invention provides of fabricating corrosion free metal lines. The method involves forming a thin polymeric passivation layer over the metal layer immediately after the metal deposition and before any photolithographic or etching processes. The polymeric passivation is formed using a F-containing gas plasma treatment.

The method comprises forming a metal layer, preferably composed of AlSiCu (e.g., 98.5% Al, 1% Si, 0.5% Cu) or a Al—Si alloy, over a semiconductor structure. The metal layer is preferably composed of AlSiCu.

Next, in a critical step, the metal layer is treated with a F-containing plasma forming a passivation layer 30 over the metal layer. The fluorine (F) plasma treatment of the invention is preferably performed within 1 hour of the metal deposition, but this varies depending on the fabrication environment. The passivation layer prevents corrosion of the metal layer before a metal etch. The passivation layer is preferably composed of a polymeric of C, O and F and the passivation layer has a thickness in a range of between about 40 and 80 Å. The passivation layer is formed using a F-containing plasma treatment preferably at a power of between 225 and 275 W, a pressure between about 80 and 120 mtorr, a $CHF_3$ flow between about 40 and 60 sccm and for a duration between about 10 to 30 seconds.

Following this, a photoresist pattern is formed over the passivation layer. The passivation layer and the metal layer are etched using the photoresist pattern as an etch mask forming a metal pattern. The etch also deposits a sidewall polymer over the sidewalls of the metal pattern and the photoresist pattern. The sidewall polymer, the photoresist pattern and the passivation layer are then removed.

In contrast with the prior art, the present invention recognizes the problem that, immediately after metal deposition, the metal layer can be corroded. The invention therefore forms a polymeric passivation layer over the metal layer immediately after the metal layer is deposited. On the other hand, the efforts of the previous patentees is directed at preventing corrosion after (not before) the metal is etched or the photoresist is ashed.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of fabricating corrosion free metal lines. The method involves forming a thin polymeric passivation layer over the metal layer right after the metal deposition and before any photolithographic or etching processes. The polymeric passivation is formed using a F-containing gas plasma treatment.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

Figure 1:
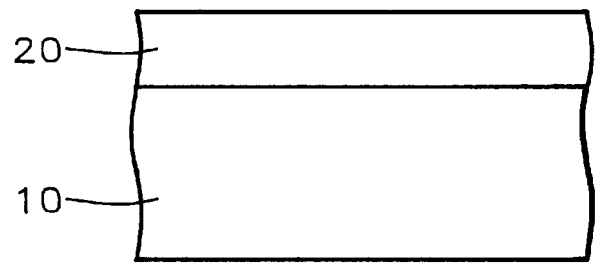
FIGS. 1 through 5 are cross sectional views for illustrating a method manufacturing a corrosion free metal line using the F-containing gas plasma treatment of the present invention.

As shown in FIG. 1, a metal layer 20 is formed over a semiconductor structure 10. The semiconductor structure can comprise a semiconductor substrate, such as a silicon substrate and can further comprise devices (e.g., source and drain regions) formed in the substrate and devices formed over the substrate, such as gate electrodes, capacitors, insulating layers and conductive layers. The surface of the substrate on which the wiring layer is formed is generally covered with an unillustrated insulating layer composed of $SiO_2$, etc. The surface of the substrate or a lower layer of wiring is exposed inside a contact hole provided on a part of the insulating layer. To prevent an increase in contact resistance of an aluminum or aluminum alloy thin film wiring due to an alloy reaction with a silicon wafer, a so-called barrier metal (not shown) of thin film of Ti, TiN or TiW is preferably provided between the silicon wafer and the aluminum thin film.

An insulating layer (unillustrated) can be is formed over the semiconductor structure, the insulating layer composed of silicon oxide formed by a thermal oxidation process at a temperature between about 900° and 1100° C. at an $O_2$ flow of about 91 and 111 sccm and having a thickness in a range of between about 900 and 1100 Å.

Still referring to FIG. 1, a metal layer 20 is formed over a semiconductor structure. The metal layer is preferably composed of an Aluminum alloy such as a AlSiCu (98.5% Al, 1% Si, 0.5% Cu) or a AlSi alloy (98% Al (±0.5%), 1% Si (±0.5%)). The invention is not limited to Aluminum alloys and can be implemented on other metals that have corrosion problems.

A preferred metal layer 20 is composed of AlSiCu and formed by sputter deposition at power between about 5000 and 7000 W (more preferably of about 6000 W), at a pressure between about 2 and 7 mtorr (and more preferably at about 5 mtorr), at a temperature between about 90° and 110° C. (and more preferably of about 100° C.) and the metal layer preferably has a thickness in a range of between about 4000 and 15,000 Å.

We have found that if the semiconductor structures (with the metal layer 20) are stored for relatively short periods of time, the metal layer corrodes. The metal layer can corrode in a short a time as a half hour. The environment the wafer is exposed can have trace amounts of corrosive chemicals (e.g., approximately 15 ppb HCL) that can corrode the metal layer. Also, often wafers are "banked" or stored with the metal layer unprotected and unpatterned. The wafers are stored or "banked" after metal deposition because the wafers can be sold to customers who will perform the back end processing. Some customers may only perform back end processing on a subset of the wafer lot and store the remainder for future customization. We have observed corrosion on wafers stored from as little as 7 days worst case. Banking of wafer is typically between several days and several days.

Figure 2:
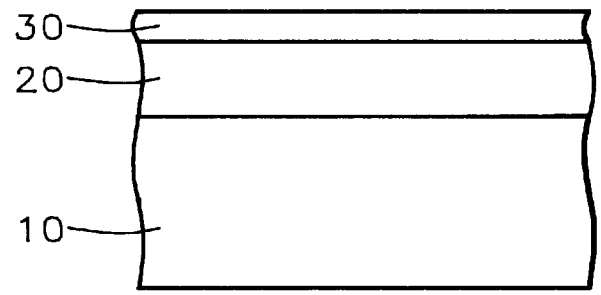

The critical step of the invention—the F-containing gas plasma treatment is performed next as shown in FIG. 2. The F-plasma treatment is preferably performed within 1 hour of depositing the metal layer and more preferably with 1 hours. The wafers are preferably stored in a $N_2$ gas box or the plasma treatment can be performed in-situ just after the metal deposition. This is very important to store the untreated metal in an $N_2$ atmosphere to prolong the time of corrosion.

The metal layer 20 is treated with a F-containing plasma thus forming a passivation layer 30 over the metal layer. The passivation layer 30 prevents corrosion of the metal layer before a metal etch.

The fluorine (F)-containing plasma comprises a plasma treatment at power of between 225 and 275 W (and more preferably of about 250 W), a pressure between about 80 and 120 mtorr (and more preferably of about 100 mtorr), a $CHF_3$ flow between about 40 and 60 sccm (and more preferably of about 50 sccm) and for a duration between about 10 to 30 seconds (and more preferably of about 20 seconds). The F-containing gas can be any F-gas such as CHF3, $CF_4$ or $NF_4$, etc., and is preferably $CHF_3$.

The passivation layer 30 is preferably composed of a polymeric of C, O and F and the passivation layer preferably has a thickness in a range of between about 30 and 80 Å and more preferably between about 30 and 60 Å. The plasma treatment allows the $CHF_3$ to react with the AlSiCu metal to form a protective polymeric layer.

Figure 6A:
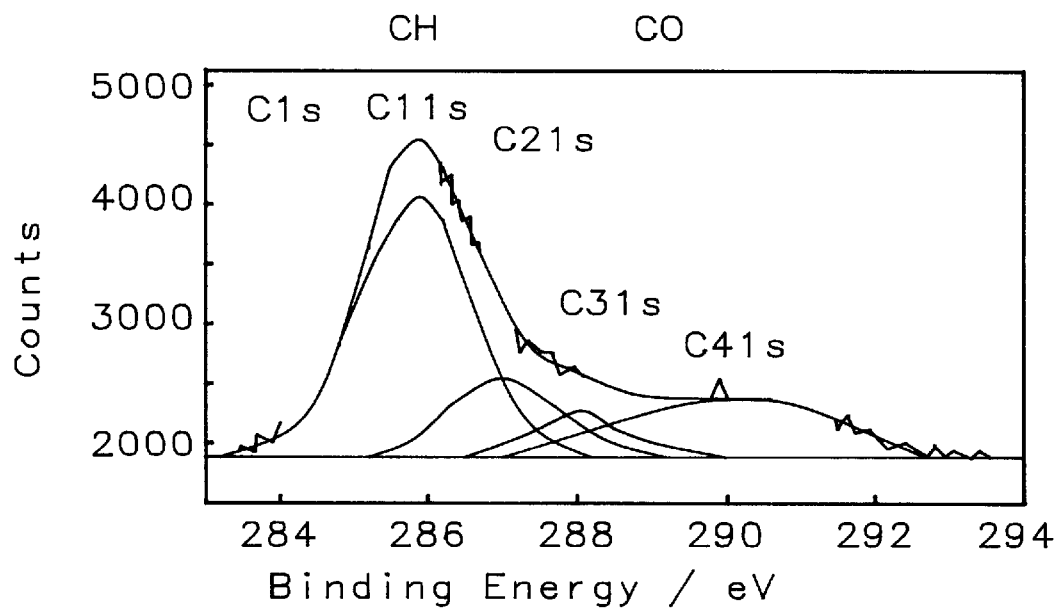
FIG. 6(a) is an ECSA spectrum of a untreated metal layer surface.
Figure 6B:
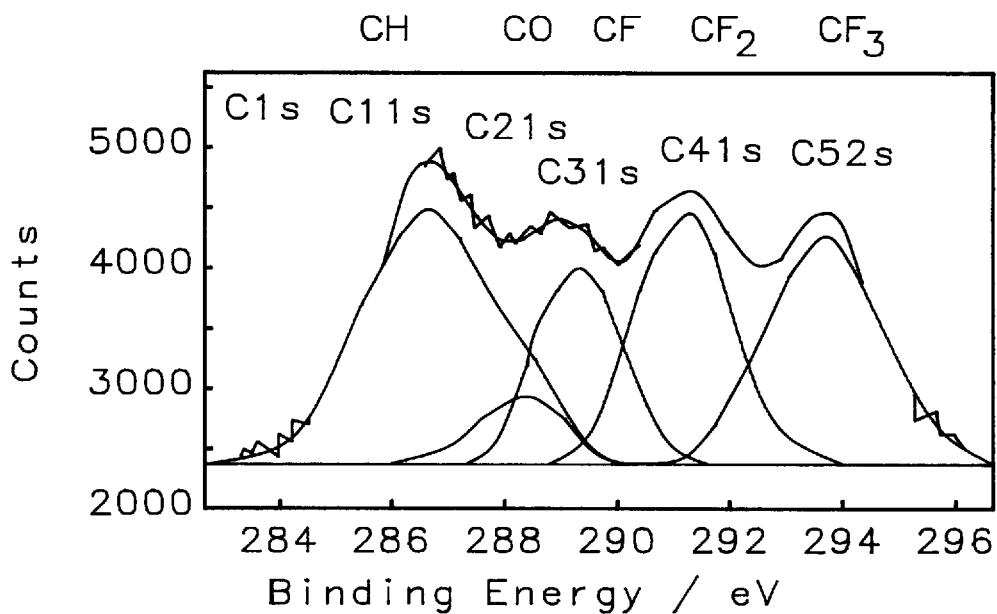
FIG. 6(b) is an ECSA spectrum of the passivation layer and metal layer surfaces showing the composition of the passivation layer of the present invention.
Figure 6C:
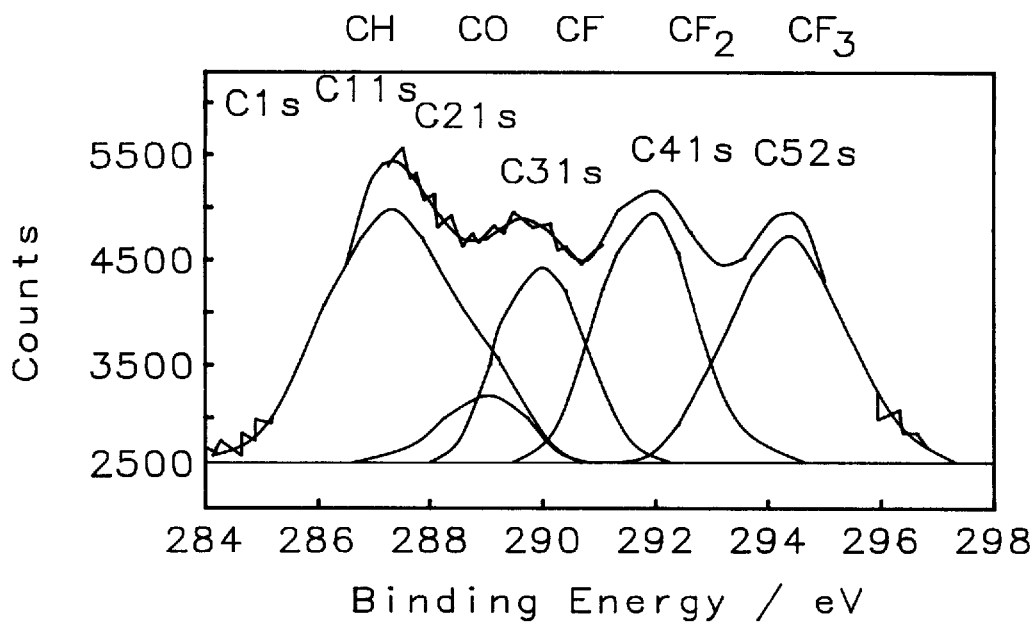
FIG. 6(c) is an ECSA spectrum of the passivation layer and metal layer surfaces after exposure to HCl showing the composition of the passivation layer of the present invention.

FIG. 6(a) shows an Electron Spectrum Chemical Analysis (ESCA) of the metal surface. FIG. 6(b) shows a ESCA spectrum of a the passivation layer 30 of the present invention formed by the F-plasma treatment. The ESCA spectrum shows that the passivation layer is formed of a CO, CF, CF2 and CF3 polymer. FIG. 6(*c*) shows the passivation layer 30 after exposure to HCL. The passivation layer is unchanged and still intact therefore still protecting the metal layer 20 from corrosive chemicals in the environment.

Figure 3:
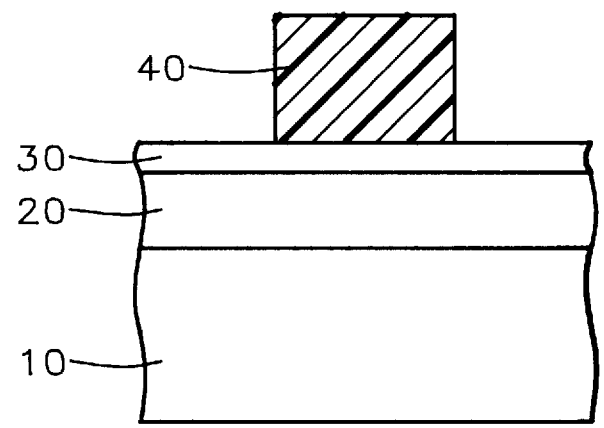

As shown in FIG. 3, a photoresist pattern 40 is formed over the passivation layer 30. The photoresist patter can be formed by conventional processes.

Figure 4:
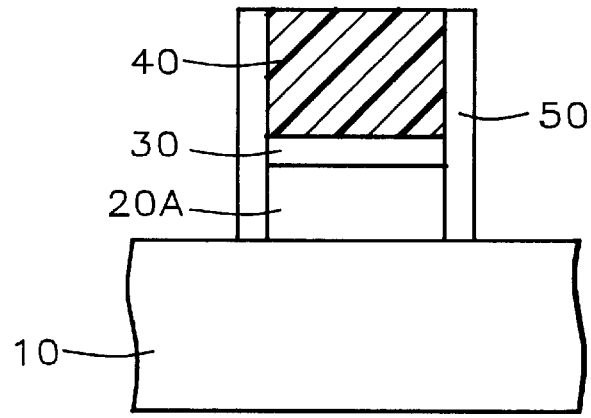

Now referring to FIG. 4, the passivation layer and the metal layer are etched using the photoresist pattern 40 as an etch mask forming a metal pattern 20A. The etch also deposits a sidewall polymer 50 over the sidewalls of the metal pattern 20A and the photoresist pattern 50. The passivation layer and the metal is preferably etched using a $CHF_3$ RIE etch.

Figure 5:
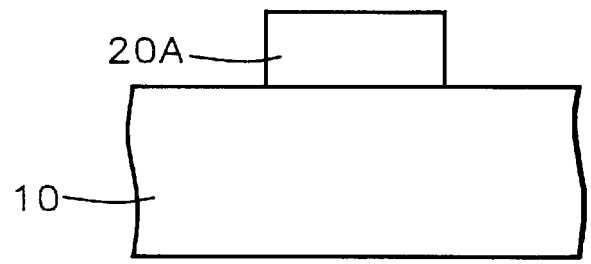

As shown in FIG. 5, the sidewall polymer 50, the photoresist pattern 40 and the passivation layer 30 are now removed. The sidewall polymer, the photoresist pattern and the passivation layer are preferably removed using a EKC® (or other photoresist stripping solution). The removal of the sidewall polymer, the photoresist pattern and the passivation layer can be performed by $O_2$ ashing process.

Example/Experiment

The following experiment was performed to determine the effectiveness of the passivation layer 30 of the present invention. Test samples were made by forming a thermal oxide layer (about 1000 Å) over a silicon wafer (100 crystal orientation). Next a TiW Barrier metal layer (~1200 Å) was sputter over the thermal oxide layer. An AlSiCu metal layer was sputtered over the TiW barrier metal layer. The metal layer was formed by sputtering the metal at a power of about 6000 watts, at a pressure of about 5 mtorr, at a temperature of about 100° C., for a time of about 65 seconds and the AlSiCu layer has a thickness of about 9000 Å. The wafers were then split in two groups—(1) passivation layer wafer group and (2) the no passivation layer group. The wafers in the passivation layer group were treated with the F-plasma treatment to grow a passivation layer (30 to 60 Å) over the metal layer. Wafers from both groups were then exposed to a HCL gas containing environment (~60 ppb). Wafers from both groups were inspected periodically. The results are shown in table 1 below.

TABLE 1

Results of the HCL metal exposure test with and without the F-plasma treatment of the present invention.

| | HCL (~60 PPB) test result | | |
|---|---|---|---|
| Process | 30 min | 8 hrs | 12 Hrs |
| No passivation plasma treatment | Corrosion | | |
| Invention's Passivation plasma treatment. | No corrosion | No corrosion | No corrosion |

Table 1 shows that the passivation layer 30 of the present invention is effective in protecting the metal layer from corrosion. On the other hand, the unprotected metal layer was corroded in a short time.

Other tests have shown that unprotected metal layer can corrode in less than 2 hours at a Cl concentration of about 5 ppb and in less than 30 minutes at a Cl concentration about 60 ppb. On the other hand, metal layer protected with the passivation layer of the present invention has not corroded when exposed to a Cl concentration of about 60 ppb for more than 12 hours.

The present invention provides an effective inexpensive method to prevent metal lines from corrosion immediately after the metal layer is deposited. The F-containing gas plasma process produces a polymeric passivation film that protects the metal layer from chlorine and other corrosive chemicals while not interfering with the subsequent metal photolithography and etching steps.

The present invention, in contrast with the prior art, recognized the problem that, immediately after metal deposition, the metal layer can be corroded. The invention therefore forms a polymeric passivation layer over the metal layer immediately after the metal layer is deposited.

While the invention has been particularly shown and described with reference to the preferred embodiments thereof, it will be understood by those skilled in the art that various changes in form and details may be made without departing from the spirit and scope of the invention.

What is claimed is:

1. A method of fabricating corrosion free metal lines comprising:

a) forming a metal layer over a semiconductor structure; said metal layer having an exposed surface and a bottom surface over said semiconductor structure;

b) before forming any other layers or performing any intervening operations to said metal layer; treating said metal layer with a F-containing plasma forming a passivation layer on the entire exposed surface of said metal layer; whereby said passivation layer prevents corrosion of said metal layer while in storage or before a metal etch.

2. The method of claim 1 wherein said passivation layer is formed over said metal layer within 1 hour of the formation of said metal layer.

3. The method of claim 1 wherein said passivation layer is formed over said metal layer within 0.5 hour of the formation of said metal layer.

4. The method of claim 1 which further includes:

a) forming a photoresist pattern over said passivation layer; said photoresist pattern having sidewalls;

b) etching said passivation layer and said metal layer using said photoresist pattern as an etch mask forming a metal pattern; said metal pattern having sidewalls; and c) removing said photoresist pattern and said passivation layer.

5. The method of claim 1 which further includes before step (a): forming an insulating layer over said semiconductor structure, said insulating layer composed of silicon oxide formed by a thermal oxidation process at a temperature between 900° and 1100° C. at an $O_2$ flow of 91 and 111 sccm and having a thickness in a range of between 900 and 1100 Å.

6. The method of claim 1 wherein said metal layer is composed of AlSiCu formed by sputter deposition at power between 5000 and 7000 W, at a pressure between 2 and 7 mtorr, at a temperature between 90° and 110° C. and said metal layer having a thickness in a range of between 4000 and 15,000 Å.

7. The method of claim 1 wherein said metal layer is composed of AlSiCu having a thickness in a range of between 4000 and 15,000 Å.

8. The method of claim 1 wherein said passivation layer is composed of a polymeric of C, O, and F; and said passivation layer having a thickness in a range of between 40 and 80 Å.

9. The method of claim 1 wherein said F-containing plasma comprising a plasma treatment at power of between 225 and 275 W, a pressure between 80 and 120 mtorr, a $CHF_3$ flow between 40 and 60 sccm and for a duration between 10 to 30 seconds.

10. The method of claim 4 wherein the removal of said photoresist pattern and said passivation layer is performed by an $O_2$ ashing process.

11. A method of fabrication a corrosion free metal layer comprising
   a) forming a metal layer composed of AlSiCu over a semiconductor structure;
   b) treating said metal layer with a F-containing plasma forming a passivation layer over said metal layer within 0.5 hours of the formation of said metal layer; said F-containing plasma comprising a plasma treatment at power of between 225 and 275 W, a pressure between about 80 and 120 mtorr, a $CHF_3$ flow between about 40 and 60 sccm and for a duration between about 10 to 30 seconds; said passivation layer is composed of a polymeric of C, O and F and said passivation layer has a thickness in a range of between about 40 and 80 Å; whereby said passivation layer prevents corrosion of said metal layer before a metal etch.

12. The method of claim 11 which further includes:
   a) forming a photoresist pattern over said passivation layer; said photoresist pattern having sidewalls;
   b) etching said passivation layer and said metal layer using said photoresist pattern as an etch mask forming a metal pattern; said metal pattern having sidewalls; and depositing a sidewall polymer over the sidewalls of said metal pattern and said photoresist pattern; and
   c) removing said sidewall polymer, said photoresist pattern and said passivation layer.

13. The method of claim 11 which further includes before step (a), forming a insulating layer over said semiconductor structure, said insulating layer composed of silicon oxide formed by a thermal oxidation process at a temperature between about 900° and 110° C. at an $O_2$ flow of about 91 and 111 sccm and having a thickness in a range of between about 900 and 110 Å.

14. The method of claim 11 wherein said metal layer is composed of AlSiCu formed by sputter deposition at power between about 5000 and 7000 W, at a pressure between about 2 and 7 mtorr, at a temperature between about 90° and 110° C. and said metal layer having a thickness in a range of between about 4000 and 15,000 Å.

15. The method of claim 11 wherein said metal layer is composed of AlSiCu having a thickness in a range of between about 4000 and 15,000 Å.

16. The method of claim 11 wherein the removal of said sidewall polymer, said photoresist pattern and said passivation layer is performed by $O_2$ ashing process.

17. A method of fabrication a corrosion free metal layer comprising
   a) forming a metal layer composed of AlSiCu over a semiconductor structure; said metal layer having a thickness in a range of between about 4000 and 15,000 Å;
   b) treating said metal layer with a F-containing plasma forming a passivation layer over said metal layer within 0.5 hours of the formation of said metal layer; said F-containing plasma comprising a plasma treatment at power of between 225 and 275 W, a pressure between about 80 and 120 mtorr, a $CHF_3$ flow between about 40 and 60 sccm and for a duration between about 10 to 30 seconds; said passivation layer is composed of a polymeric of C, O and F and said passivation layer has a thickness in a range of between about 40 and 80 Å; whereby said passivation layer prevents corrosion of said metal layer before a metal etch;
   c) forming a photoresist pattern over said passivation layer; said photoresist pattern having sidewalls;
   d) etching said passivation layer and said metal layer using said photoresist pattern as an etch mask forming a metal pattern; said metal pattern having sidewalls; and deposition a sidewall polymer over the sidewalls of said metal pattern and said photoresist pattern; and
   e) removing said sidewall polymer, said photoresist pattern and said passivation layer.

18. A method of fabricating corrosion free metal lines comprising:
   a) forming a metal layer over a semiconductor structure;
   b) treating said metal layer with a F-containing plasma forming a passivation layer over said metal layer; whereby said passivation layer prevents corrosion of said metal layer before a metal etch;
   c) forming a photoresist pattern over said passivation layer; said photoresist pattern having sidewalls;
   d) etching said passivation layer and said metal layer using said photoresist pattern as an etch mask forming a metal pattern; said metal pattern having sidewalls; and depositing a sidewall polymer over the sidewalls of said metal pattern and said photoresist pattern; and
   e) removing said sidewall polymer, said photoresist pattern and said passivation layer.

19. The method of claim 18 wherein the removal of said sidewall polymer, said photoresist pattern and said passivation layer is performed by $O_2$ ashing process.

20. A method of fabricating corrosion free metal lines comprising:
   a) forming a metal layer over a semiconductor structure;
   b) treating said metal layer with a F-containing plasma forming a passivation layer over said metal layer; whereby said passivation layer prevents corrosion of said metal layer before a metal etch;
   said passivation layer is composed of a polymeric of C, O, and F; and said passivation layer having a thickness in a range of between 40 and 80 Å.

21. A method of fabrication a corrosion free metal lines consisting of:
   a) forming a metal layer over a semiconductor structure; said metal layer having an exposed surface;
   b) treating said metal layer with a F-containing plasma forming a passivation layer on the entire exposed surface said metal layer; whereby said passivation layer prevents corrosion of said metal layer before a metal etch or while in storage.

22. The method of claim 21 which further includes after step (b), said semiconductor structure is stored before said metal layer is patterned.

* * * * *